US012685030B2

(12) United States Patent
Lee et al.

(10) Patent No.: US 12,685,030 B2
(45) **Date of Patent: \*Jul. 14, 2026**

(54) MAGNETIC MEMORY DEVICE WITH DIFFUSION BARRIER

(71) Applicant: Samsung Electronics Co., Ltd., Suwon-si (KR)

(72) Inventors: Joonmyoung Lee, Gwacheon-si (KR); Whankyun Kim, Seoul (KR); Eunsun Noh, Yongin-si (KR); Junho Jeong, Hwaseong-si (KR); Youngjun Cho, Hwaseong-si (KR)

(73) Assignee: Samsung Electronics Co., Ltd., Suwon-si (KR)

( \* ) Notice: Subject to any disclaimer, the term of this patent is extended or adjusted under 35 U.S.C. 154(b) by 962 days.

This patent is subject to a terminal disclaimer.

(21) Appl. No.: 17/952,808

(22) Filed: Sep. 26, 2022

(65) Prior Publication Data

US 2023/0117646 A1 Apr. 20, 2023

(30) Foreign Application Priority Data

Oct. 14, 2021 (KR) ........................ 10-2021-0136718

(51) Int. Cl.
*H10N 50/80* (2023.01)
*H10B 61/00* (2023.01)
(Continued)

(52) U.S. Cl.
CPC ............. *H10N 50/80* (2023.02); *H10B 61/22* (2023.02); *H10N 50/01* (2023.02); *H10N 50/85* (2023.02)

(58) Field of Classification Search
CPC ........ H10N 50/80; H10N 50/01; H10N 50/85; H10N 50/10; H10B 61/22; G11C 11/161
See application file for complete search history.

(56) References Cited

U.S. PATENT DOCUMENTS 8,878,318 B2 11/2014 Chen et al.
9,425,387 B1 \* 8/2016 Liu ........................ H10N 50/85
(Continued)

FOREIGN PATENT DOCUMENTS

JP 2004172599 A \* 6/2004
KR 2016-0056377 A 5/2016
KR 2020-0057610 A 5/2020

OTHER PUBLICATIONS

"The interactive Ellingham diagram", Dissemination of IT for the Promotion of Materials Science (DoITPoMS), https://www.doitpoms.ac.uk/tlplib/ellingham_diagrams/interactive.php, 2004.
(Continued)

*Primary Examiner* — William B Partridge
*Assistant Examiner* — Linda J. Fleck
(74) *Attorney, Agent, or Firm* — Fish & Richardson P.C.

(57) ABSTRACT

A magnetic memory device includes a pinned magnetic pattern, a tunnel barrier pattern, a free magnetic pattern, a diffusion barrier pattern, a non-magnetic pattern and a capping pattern, which are sequentially stacked on a substrate. The diffusion barrier pattern includes a first non-magnetic metal and oxygen. The non-magnetic pattern includes a second non-magnetic metal and oxygen. An oxide formation energy of the first non-magnetic metal is lower than an oxide formation energy of the second non-magnetic metal.

20 Claims, 13 Drawing Sheets

(51) Int. Cl.
  H10N 50/01 (2023.01)
  H10N 50/85 (2023.01)

(56) References Cited

U.S. PATENT DOCUMENTS

| | | | | |
|---|---|---|---|---|
| 9,640,755 | B2 | 5/2017 | Lee et al. | |
| 9,859,488 | B2 | 1/2018 | Lee et al. | |
| 9,966,529 | B1 * | 5/2018 | Iwata | H10N 50/85 |
| 10,020,446 | B2 * | 7/2018 | Sandhu | H10N 50/80 |
| 10,147,873 | B2 | 12/2018 | Lee et al. | |
| 10,522,752 | B1 | 12/2019 | Jan et al. | |
| 10,950,660 | B2 | 3/2021 | Oguz et al. | |
| 11,009,570 | B2 | 5/2021 | Ikhtiar et al. | |
| 12,477,956 | B2 * | 11/2025 | Lee | H10N 50/80 |
| 2016/0133307 | A1 * | 5/2016 | Lee | H10N 50/85 |
| | | | | 257/421 |
| 2017/0092848 | A1 | 3/2017 | Jang et al. | |
| 2018/0123025 | A1 * | 5/2018 | Lee | H10N 50/10 |
| 2020/0006425 | A1 | 1/2020 | Lin et al. | |
| 2020/0027920 | A1 * | 1/2020 | Miura | H10N 50/10 |
| 2020/0158796 | A1 * | 5/2020 | Ikhtiar | H10N 50/10 |
| 2020/0365308 | A1 | 11/2020 | Lin et al. | |
| 2020/0403149 | A1 | 12/2020 | Guisan et al. | |
| 2021/0098369 | A1 | 4/2021 | Kuang et al. | |
| 2021/0175413 | A1 | 6/2021 | Watanabe et al. | |
| 2023/0074076 | A1 * | 3/2023 | Lee | H10N 50/85 |
| 2024/0284802 | A1 * | 8/2024 | Shin | H10N 50/10 |

OTHER PUBLICATIONS

Aleksey N. Kolmogorov et al., "Theoretical study of metal borides stability", Department of Mechanical Engineering and Materials Science, Duke University, 14 pages, Feb. 6, 2008.

* cited by examiner

MAGNETIC MEMORY DEVICE WITH DIFFUSION BARRIER

CROSS-REFERENCE TO RELATED APPLICATION

This U.S. non-provisional patent application claims priority under 35 U.S.C. § 119 to Korean Patent Application No. 10-2021-0136718, filed on Oct. 14, 2021, in the Korean Intellectual Property Office, the entire contents of which are hereby incorporated by reference.

BACKGROUND

The present inventive concepts relate to magnetic memory devices that include at least one magnetic tunnel junction.

As high-speed and/or low power consumption electronic devices have been demanded, high-speed and/or low-voltage semiconductor memory elements used therein have also been demanded. Magnetic memory elements have been developed as semiconductor memory elements capable of satisfying these demands. The magnetic memory devices may emerge as next-generation semiconductor memory elements because of their high-speed and/or non-volatile characteristics.

In general, a magnetic memory device may include a magnetic tunnel junction (MTJ) pattern. The magnetic tunnel junction pattern may include two magnetic layers and an insulating layer disposed between the two magnetic layers. A resistance value of the magnetic tunnel junction pattern may be changed depending on magnetization directions of the two magnetic layers. For example, the magnetic tunnel junction pattern may have a relatively high resistance value when the magnetization directions of the two magnetic layers are antiparallel to each other, and the magnetic tunnel junction pattern may have a relatively low resistance value when the magnetization directions of the two magnetic layers are parallel to each other. The magnetic memory device may write/read data using a difference between the resistance values of the magnetic tunnel junction pattern.

Highly integrated and/or low-power magnetic memory devices have been increasingly demanded with the development of an electronic industry. Thus, various researches are being conducted to satisfy these demands.

SUMMARY

Some example embodiments of the inventive concepts may provide a magnetic memory device including a magnetic tunnel junction pattern with improved switching characteristics, and a method of manufacturing the same.

Some example embodiments of the inventive concepts may also provide a magnetic memory device including a magnetic tunnel junction pattern with improved thermal resistance with respect to a high-temperature manufacturing process, and a method of manufacturing the same.

In some example embodiments, a magnetic memory device may include a pinned magnetic pattern, a tunnel barrier pattern, a free magnetic pattern, a diffusion barrier pattern, a non-magnetic pattern and a capping pattern, which are sequentially stacked on a substrate. The diffusion barrier pattern may include a first non-magnetic metal and oxygen. The non-magnetic pattern may include a second non-magnetic metal and oxygen. An oxide formation energy of the first non-magnetic metal may be lower than an oxide formation energy of the second non-magnetic metal.

In some example embodiments, a magnetic memory device may include a pinned magnetic pattern, a tunnel barrier pattern, a free magnetic pattern, a diffusion barrier pattern, a non-magnetic pattern and a capping pattern, which are sequentially stacked on a substrate. The diffusion barrier pattern may include a first non-magnetic metal, oxygen, and boron. The non-magnetic pattern may include a second non-magnetic metal, oxygen, and boron. A boride formation energy of the first non-magnetic metal may be lower than a boride formation energy of the second non-magnetic metal.

In some example embodiments, a magnetic memory device may include a first conductive line on a substrate, a second conductive line extending over the first conductive line, and a memory cell between the first conductive line and the second conductive line. The memory cell may include a pinned magnetic pattern, a tunnel barrier pattern, a free magnetic pattern, a diffusion barrier pattern, a non-magnetic pattern and a capping pattern, which are sequentially stacked. The diffusion barrier pattern may include hafnium, oxygen, and boron. The non-magnetic pattern may include tantalum, oxygen, and boron. Each of the diffusion barrier pattern and the non-magnetic pattern may have a thickness of 1 Å to 15 Å.

DETAILED DESCRIPTION

Figure 1:
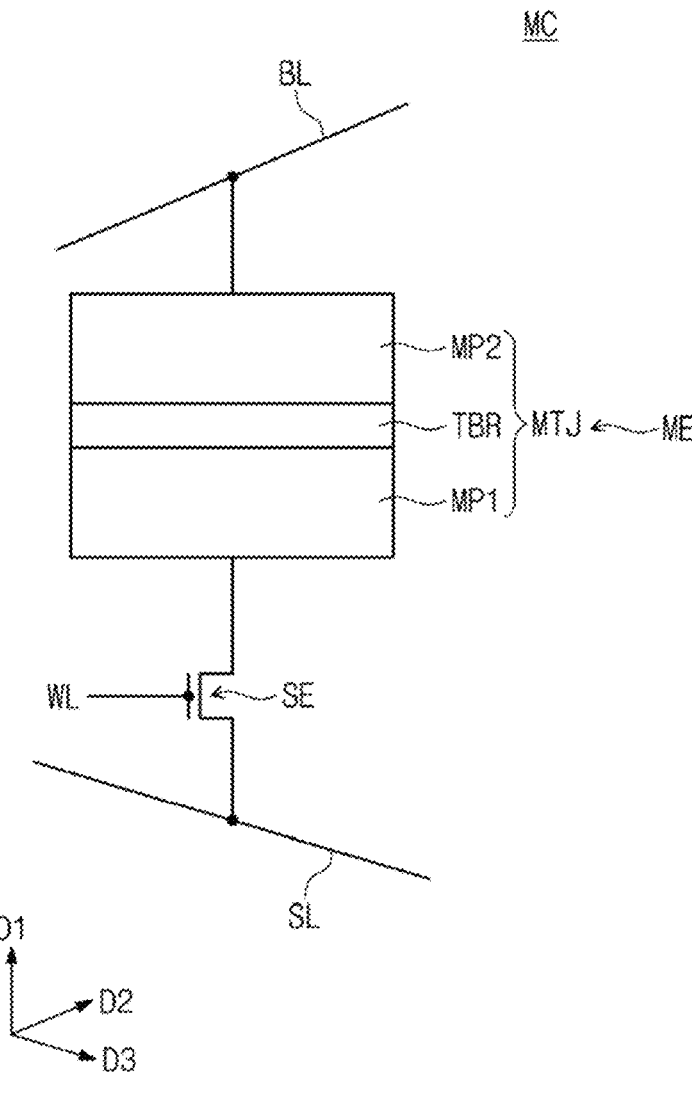
FIG. 1 is a circuit diagram illustrating a unit memory cell of a magnetic memory device according to some example embodiments of the inventive concepts.

Hereinafter, some example embodiments of the present inventive concepts will be described in detail so that a person skilled in the art would understand the same. The inventive concepts may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present such that the element and the other element are isolated from direct contact with each other by one or more interposing spaces and/or structures. In contrast, when an element is referred to as being "directly on" another element, there are no intervening elements present such that the element and the other element are in direct contact with each other. As described herein, an element that is "on" another element may be above, beneath, and/or horizontally adjacent to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

FIG. 1 is a circuit diagram illustrating a unit memory cell of a magnetic memory device according to some example embodiments of the inventive concepts.

Referring to FIG. 1, a unit memory cell MC may include a memory element ME and a selection element SE. The memory element ME and the selection element SE may be electrically connected in series to each other in a first direction D1. The memory element ME may be connected between a bit line BL and the selection element SE. The selection element SE may be connected between the memory element ME and a source line SL and may be controlled by a word line WL. The source line SL may be a first conductive line on a substrate, and the bit lint BL may be a second conductive line extending over (e.g., crossing over) the source line SL (e.g., the first conductive line), where the unit memory cell MC is between the source line SL (e.g., first conductive line) and the bit line BL (e.g., second conductive line). For example, the selection element SE may include a bipolar transistor or a MOS field effect transistor. The bit line BL may extend in a second direction D2. The source line SL may extend in a third direction D3 intersecting the second direction D2. Even though not shown in the drawings, the word line WL may extend in the third direction D3.

The memory element ME may include a magnetic tunnel junction MTJ, and the magnetic tunnel junction MTJ may include a first magnetic pattern MP1, a second magnetic pattern MP2, and a tunnel barrier pattern TBR provided between the first and second magnetic patterns MP1 and MP2. One of the first and second magnetic patterns MP1 and MP2 may be a pinned magnetic pattern of which a magnetization direction is fixed in one direction regardless of an external magnetic field under a general use environment. The other of the first and second magnetic patterns MP1 and MP2 may be a free magnetic pattern of which a magnetization direction is changeable between two stable magnetization directions by an external magnetic field. An electrical resistance of the magnetic tunnel junction MTJ when the magnetization directions of the pinned and free magnetic patterns are antiparallel to each other may be much greater than that of the magnetic tunnel junction MTJ when the magnetization directions of the pinned and free magnetic patterns are parallel to each other. In other words, the electrical resistance of the magnetic tunnel junction MTJ may be adjusted by changing the magnetization direction of the free magnetic pattern. Thus, logical data may be stored in the memory element ME of the unit memory cell MC by using an electrical resistance difference according to the magnetization directions of the pinned and free magnetic patterns.

Figure 2:
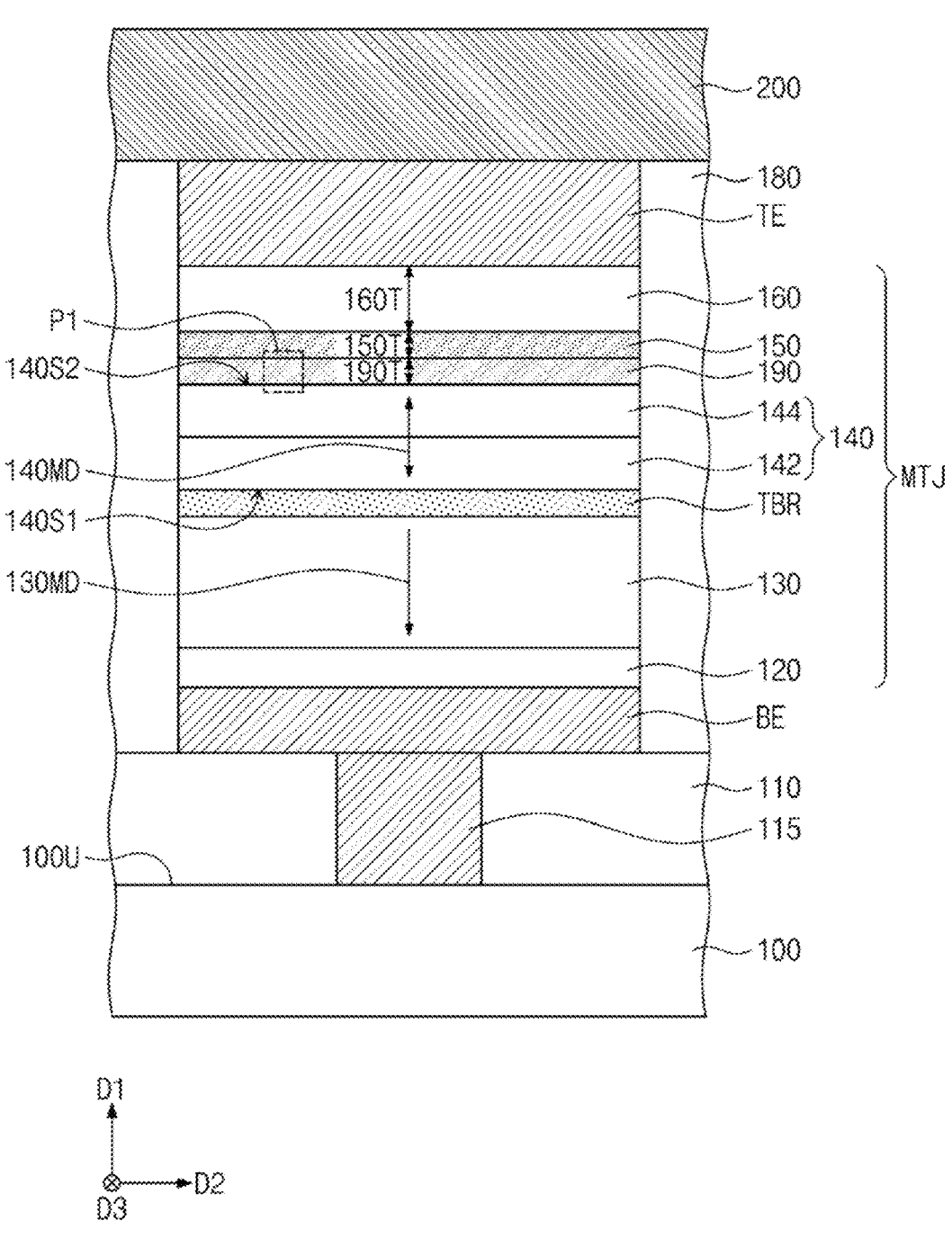
FIG. 2 is a cross-sectional view illustrating a magnetic memory device according to some example embodiments of the inventive concepts.

FIG. 2 is a cross-sectional view illustrating a magnetic memory device according to some example embodiments of the inventive concepts.

Referring to FIG. 2, a first interlayer insulating layer 110 may be disposed on a substrate 100, and a first contact plug 115 may be disposed in the first interlayer insulating layer 110. The substrate 100 may be a semiconductor substrate including silicon (Si), silicon-on-insulator (SOI), silicon-germanium (SiGe), germanium (Ge), or gallium-arsenic (GaAs). The first interlayer insulating layer 110 may include, for example, an oxide, a nitride, and/or an oxynitride.

The first contact plug 115 may penetrate the first interlayer insulating layer 110 and may be electrically connected to the substrate 100. Even though not shown in FIG. 2, the source line SL of FIG. 1 may be disposed in or on the substrate 100. The selection element SE of FIG. 1 may be connected to the source line SL. The selection element may be, for example, a field effect transistor. The first contact plug 115 may be electrically connected to one terminal (e.g., a source/drain terminal) of the selection element. The first contact plug 115 may include at least one of a doped semiconductor material (e.g., doped silicon), a metal (e.g., tungsten, titanium, and/or tantalum), a metal-semiconductor compound (e.g., a metal silicide), or a conductive metal nitride (e.g., titanium nitride, tantalum nitride, and/or tungsten nitride).

A lower electrode BE, a magnetic tunnel junction pattern MTJ and an upper electrode TE may be sequentially stacked on the first contact plug 115. The lower electrode BE, the magnetic tunnel junction pattern MTJ and the upper electrode TE may be sequentially stacked in a first direction D1 perpendicular to a top surface 100U of the substrate 100. The lower electrode BE may be disposed between the first contact plug 115 and the magnetic tunnel junction pattern MTJ, and the magnetic tunnel junction pattern MTJ may be disposed between the lower electrode BE and the upper electrode TE. The lower electrode BE may be electrically connected to the first contact plug 115. For example, the lower electrode BE may include a conductive metal nitride (e.g., titanium nitride or tantalum nitride). The upper electrode TE may include at least one of a metal (e.g., Ta, W, Ru, or Ir) or a conductive metal nitride (e.g., TiN).

The magnetic tunnel junction pattern MTJ may include a seed pattern 120, a pinned magnetic pattern 130, a tunnel barrier pattern TBR, a free magnetic pattern 140, a diffusion barrier pattern 190, a non-magnetic pattern 150 and a capping pattern 160, which are sequentially stacked.

In detail, the magnetic tunnel junction pattern MTJ may include the pinned magnetic pattern 130, the free magnetic pattern 140, and the tunnel barrier pattern TBR between the pinned magnetic pattern 130 and the free magnetic pattern 140. In some example embodiments, the pinned magnetic pattern 130 may be disposed between the lower electrode BE and the tunnel barrier pattern TBR, and the free magnetic pattern 140 may be disposed between the upper electrode TE and the tunnel barrier pattern TBR. The magnetic tunnel junction pattern MTJ may further include the seed pattern 120 between the lower electrode BE and the pinned magnetic pattern 130, the capping pattern 160 between the upper electrode TE and the free magnetic pattern 140, the non-magnetic pattern 150 between the capping pattern 160 and the free magnetic pattern 140, and the diffusion barrier pattern 190 between the non-magnetic pattern 150 and the free magnetic pattern 140.

The seed pattern 120 may include a material for assisting the crystal growth of the pinned magnetic pattern 130. The seed pattern 120 may include at least one of, for example, chromium (Cr), iridium (Ir), or ruthenium (Ru).

The pinned magnetic pattern 130 may have a magnetization direction 130MD fixed in one direction. The magnetization direction 130MD of the pinned magnetic pattern 130 may be substantially perpendicular to an interface between the tunnel barrier pattern TBR and the free magnetic pattern 140. For example, the free magnetic pattern 140 may have a first surface 140S1 and a second surface 140S2 which are opposite to each other, the first surface 140S1 of the free magnetic pattern 140 may be adjacent to the tunnel barrier pattern TBR, and the second surface 140S2 of the free magnetic pattern 140 may be adjacent to the diffusion barrier pattern 190. The first surface 140S1 of the free magnetic pattern 140 may be in contact with the tunnel barrier pattern TBR, and the magnetization direction 130MD of the pinned magnetic pattern 130 may be substantially perpendicular to the first surface 140S1 of the free magnetic pattern 140.

The pinned magnetic pattern 130 may include a magnetic element. The pinned magnetic pattern 130 may include at least one of iron (Fe), cobalt (Co), or nickel (Ni). For example, the pinned magnetic pattern 130 may include at least one of an intrinsic perpendicular magnetic material or an extrinsic perpendicular magnetic material. The intrinsic perpendicular magnetic material may include a material which has a perpendicular magnetization property even though an external factor does not exist. The intrinsic perpendicular magnetic material may include at least one of a perpendicular magnetic material (e.g., CoFeTb, CoFeGd, or CoFeDy), a perpendicular magnetic material having a $L1_0$ structure, a CoPt alloy having a hexagonal close packed (HCP) lattice structure, or a perpendicular magnetic structure. The perpendicular magnetic material having the $L1_0$ structure may include at least one of FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers, which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where 'n' denotes the number of bilayers. The extrinsic perpendicular magnetic material may include a material which has an intrinsic horizontal magnetization property but has a perpendicular magnetization property by an external factor. For example, the extrinsic perpendicular magnetic material may have the perpendicular magnetization property by magnetic anisotropy induced by a junction of the pinned magnetic pattern 130 and the tunnel barrier pattern TBR. The extrinsic perpendicular magnetic material may include, for example, CoFeB. In some example embodiments, the pinned magnetic pattern 130 may include a Co-based Heusler alloy.

The tunnel barrier pattern TBR may include a metal oxide. For example, the tunnel barrier pattern TBR may include at least one of magnesium (Mg) oxide, titanium (Ti) oxide, aluminum (Al) oxide, magnesium-zinc (Mg—Zn) oxide, or magnesium-boron (Mg—B) oxide.

The free magnetic pattern 140 may have a magnetization direction 140MD changeable to be parallel or antiparallel to the magnetization direction 130MD of the pinned magnetic pattern 130. The magnetization direction 140MD of the free magnetic pattern 140 may be substantially perpendicular to the interface between the tunnel barrier pattern TBR and the free magnetic pattern 140. For example, the magnetization direction 140MD of the free magnetic pattern 140 may be substantially perpendicular to the first surface 140S1 of the free magnetic pattern 140.

In some example embodiments, the free magnetic pattern 140 may include a first free magnetic pattern 142 adjacent to the tunnel barrier pattern TBR, and a second free magnetic pattern 144 far from the tunnel barrier pattern TBR. The second free magnetic pattern 144 may be adjacent to the diffusion barrier pattern 190. The first free magnetic pattern 142 may be disposed between the tunnel barrier pattern TBR and the second free magnetic pattern 144, and the second free magnetic pattern 144 may be disposed between the first free magnetic pattern 142 and the diffusion barrier pattern 190.

Each of the first free magnetic pattern 142 and the second free magnetic pattern 144 may include a magnetic element. The first free magnetic pattern 142 may include at least one of iron (Fe), cobalt (Co), or nickel (Ni). For some examples, the first free magnetic pattern 142 may include cobalt-iron (CoFe). For certain examples, the first free magnetic pattern 142 may include at least one of the perpendicular magnetic material (e.g., CoFeTb, CoFeGd, CoFeDy), the perpendicular magnetic material having the $L1_0$ structure, the CoPt alloy having the hexagonal close packed (HCP) lattice structure, or the perpendicular magnetic structure. The second free magnetic pattern 144 may include a magnetic material which has a perpendicular magnetization property by magnetic anisotropy induced at an interface between the second free magnetic pattern 144 and the first free magnetic pattern 142 and/or an interface between the second free magnetic pattern 144 and the diffusion barrier pattern 190. For example, the second free magnetic pattern 144 may include cobalt-iron-boron (CoFeB). When the second free magnetic pattern 144 includes boron, a boron concentration in the second free magnetic pattern 144 may be higher than a boron concentration in the first free magnetic pattern 142. In some example embodiments, each of the first free magnetic pattern 142 and the second free magnetic pattern 144 may include a Co-based Heusler alloy.

Figure 3:
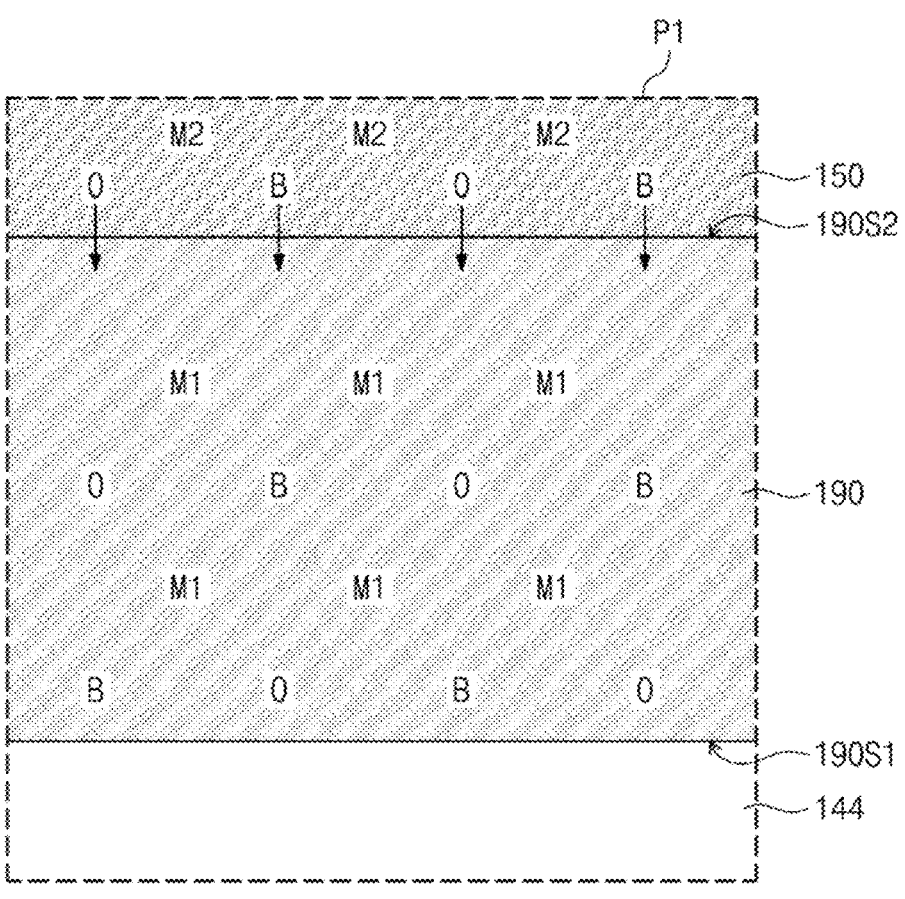
FIG. 3 is an enlarged view of a portion 'P1' of FIG. 2 according to some example embodiments of the inventive concepts.

FIG. 3 is an enlarged view of a portion 'P1' of FIG. 2 according to some example embodiments of the inventive concepts.

Referring to FIGS. 2 and 3, the diffusion barrier pattern 190 may be disposed between the non-magnetic pattern 150 and the second free magnetic pattern 144. The diffusion barrier pattern 190 may include a first non-magnetic metal M1 and may be used to enhance perpendicular anisotropy of the free magnetic pattern 140. The diffusion barrier pattern

190 may further include oxygen (O). The diffusion barrier pattern 190 may further include boron (B). The diffusion barrier pattern 190 may include an oxide of the first non-magnetic metal M1, and the oxide of the first non-magnetic metal M1 may contain boron (B). In the present specification, the diffusion barrier pattern 190 may also be referred to as 'a first metal oxide pattern'. A thickness 190T of the diffusion barrier pattern 190 may range from about 1 Å to about 15 Å.

The non-magnetic pattern 150 may be disposed (e.g., located) between the diffusion barrier pattern 190 and the capping pattern 160. The non-magnetic pattern 150 may be used to enhance the perpendicular anisotropy of the free magnetic pattern 140. The non-magnetic pattern 150 may include a second non-magnetic metal M2 and oxygen (O). The non-magnetic pattern 150 may further include boron (B). The non-magnetic pattern 150 may include an oxide of the second non-magnetic metal M2, and the oxide of the second non-magnetic metal M2 may contain boron (B). In the present specification, the non-magnetic pattern 150 may also be referred to as 'a second metal oxide pattern'. A thickness 150T of the non-magnetic pattern 150 may range from about 1 Å to about 15 Å. The diffusion barrier pattern 190 may have a first surface 190S1 being in contact with the second free magnetic pattern 144, and a second surface 190S2 being in contact with the non-magnetic pattern 150.

In some example embodiments, each of the diffusion barrier pattern 190 and the non-magnetic pattern 150 may not include boron but may exclude boron (e.g., may not include any boron).

The oxygen (O) and/or boron (B) included in the non-magnetic pattern 150 may be diffused around the non-magnetic pattern 150 at a high temperature of 400° C. or more. When the oxygen (O) and/or boron (B) included in the non-magnetic pattern 150 is diffused into the second free magnetic pattern 144, local distribution (or clumped dispersion) of an oxygen/boron content may be formed in portions of the second free magnetic pattern 144, and thus switching distribution may be deteriorated. However, the diffusion barrier pattern 190 may reduce or prevent the oxygen (O) and/or boron (B) included in the non-magnetic pattern 150 from being diffused into the second free magnetic pattern 144. Thus, uniform distribution of an oxygen concentration and a boron concentration may be formed in the portions of the second free magnetic pattern 144. As a result, it is possible to reduce or prevent deterioration of switching characteristics of the magnetic tunnel junction pattern MTJ. Therefore, the switching characteristics of the magnetic tunnel junction pattern MTJ may be improved, and thermal resistance of the magnetic tunnel junction pattern MTJ with respect to a high-temperature manufacturing process may be improved.

Figure 4:
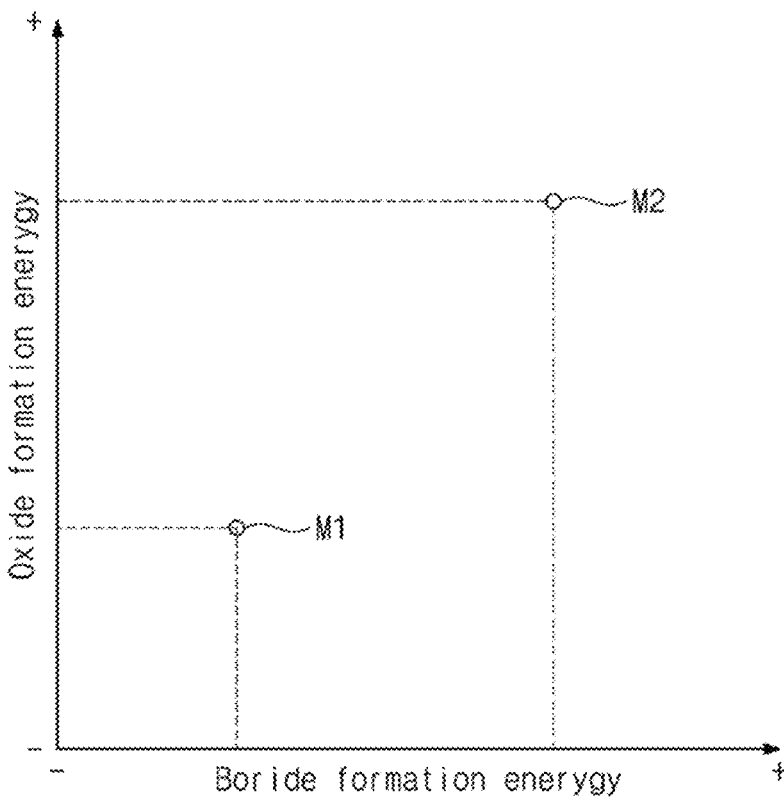
FIG. 4 is a graph showing properties of a first non-magnetic metal and a second non-magnetic metal according to some example embodiments of the inventive concepts.

FIG. 4 is a graph showing properties of a first non-magnetic metal and a second non-magnetic metal according to some example embodiments of the inventive concepts.

Referring to FIGS. 3 and 4, an oxide formation energy of the first non-magnetic metal M1 may be lower than an oxide formation energy of the second non-magnetic metal M2. In the present specification, an oxide formation energy may be defined as a value obtained by subtracting an energy of a reactant from an energy of an oxide corresponding to a product (i.e., $E_{oxide\ formation} = E_{products} - E_{reactants}$), formation of the oxide may become easier as the oxide formation energy decreases, and formation of the oxide may become more difficult as the oxide formation energy increases. In other words, the first non-magnetic metal M1 may more easily react with oxygen atoms (0) than the second non-magnetic metal M2 and may be more easily oxidized than the second non-magnetic metal M2.

A boride formation energy of the first non-magnetic metal M1 may be lower than a boride formation energy of the second non-magnetic metal M2. In the present specification, a boride formation energy may be defined as a value obtained by subtracting an energy of a reactant from an energy of a boride corresponding to a product (i.e., $E_{boride\ formation}=E_{products}-E_{reactants}$), formation of the boride may become easier as the boride formation energy decreases, and formation of the boride may become more difficult as the boride formation energy increases. In other words, the first non-magnetic metal M1 may more easily react with boron atoms (B) than the second non-magnetic metal M2 and may more easily form a boride than the second non-magnetic metal M2. The second non-magnetic metal M2 may more difficultly react with boron atoms (B) than the first non-magnetic metal M1 and may more difficultly form a boride than the first non-magnetic metal M1. The first non-magnetic metal M1 may have a relatively high reactivity to boron atoms (B) as compared with the second non-magnetic metal M2, and the second non-magnetic metal M2 may have a relatively low reactivity to boron atoms (B) as compared with the first non-magnetic metal M1.

Thus, like FIG. 3, when oxygen atoms (0) and/or boron atoms (B) included in the non-magnetic pattern 150 are diffused into the diffusion barrier pattern 190 through the second surface 190S2, the diffused oxygen atoms (0) and/or boron atoms (B) may not pass through the first surface 190S1 but may be combined with the first non-magnetic metal M1 in the diffusion barrier pattern 190. As a result, the diffusion barrier pattern 190 may reduce or prevent oxygen (O) and/or boron (B) included in the non-magnetic pattern 150 from being diffused into the second free magnetic pattern 144.

For example, the oxide formation energy of the first non-magnetic metal M1 may range from −1050 KJ/mol to −370 KJ/mol. For example, the oxide formation energy of the second non-magnetic metal M2 may range from −750 KJ/mol to +50 KJ/mol.

For example, the boride formation energy of the first non-magnetic metal M1 may range from −0.8 eV/atom to −0.5 eV/atom. For example, the boride formation energy of the second non-magnetic metal M2 may range from −0.65 eV/atom to 0.0 eV/atom.

The first non-magnetic metal M1 may include at least one of, for example, hafnium (Hf), titanium (Ti), zirconium (Zr), niobium (Nb), vanadium (V), or scandium (Sc) and may be, in particular, hafnium (Hf). The diffusion barrier pattern 190 may be boron-containing (or boron-doped) hafnium oxide (HMO).

The second non-magnetic metal M2 may include at least one of, for example, tantalum (Ta), tungsten (W), molybdenum (Mo), chromium (Cr), rhenium (Re), or manganese (Mn) and may be, in particular, tantalum (Ta). The non-magnetic pattern 150 may be boron-containing (or boron-doped) tantalum oxide (TaBO).

The oxide formation energy of the first non-magnetic metal M1 may be lower than an oxide formation energy of the magnetic element in the free magnetic pattern 140. In other words, the first non-magnetic metal M1 may more easily react with oxygen (O) than the magnetic element in the free magnetic pattern 140 and may be more easily oxidized than the magnetic element in the free magnetic pattern 140. The first non-magnetic metal M1 may have a relatively high reactivity to oxygen as compared with the magnetic element in the free magnetic pattern 140.

The capping pattern 160 may include a third non-magnetic metal, and the third non-magnetic metal may be different from the second non-magnetic metal M2. A boride formation energy of the third non-magnetic metal may be higher than the boride formation energy of the second non-magnetic metal M2. In other words, the second non-magnetic metal M2 may more easily react with boron (B) than the third non-magnetic metal and may more easily form a boride than the third non-magnetic metal. The third non-magnetic metal may more difficultly react with boron (B) than the second non-magnetic metal M2 and may more difficultly form a boride than the second non-magnetic metal M2. The second non-magnetic metal M2 may have a relatively high reactivity to boron as compared with the third non-magnetic metal, and the third non-magnetic metal may have a relatively low reactivity to boron as compared with the second non-magnetic metal M2.

An oxide formation energy of the third non-magnetic metal may be higher than the oxide formation energy of the second non-magnetic metal M2. In other words, the second non-magnetic metal M2 may more easily react with oxygen (O) than the third non-magnetic metal and may be more easily oxidized than the third non-magnetic metal. The third non-magnetic metal may more difficultly react with oxygen (O) than the second non-magnetic metal M2 and may more difficultly form an oxide than the second non-magnetic metal M2. The second non-magnetic metal M2 may have a relatively high reactivity to oxygen as compared with the third non-magnetic metal, and the third non-magnetic metal may have a relatively low reactivity to oxygen as compared with the second non-magnetic metal M2.

For example, the oxide formation energy of the third non-magnetic metal may range from −750 KJ/mol to +50 KJ/mol. For example, the boride formation energy of the third non-magnetic metal may range from −0.4 eV/atom to 0.0 eV/atom.

The third non-magnetic metal may include at least one of, for example, molybdenum (Mo), tungsten (W), chromium (Cr), rhenium (Re), or manganese (Mn). In some example embodiments, the capping pattern 160 may further include oxygen. In this case, the capping pattern 160 may include an oxide of the third non-magnetic metal.

In some example embodiments, the capping pattern 160 may be a metal layer including the third non-magnetic metal (e.g., formed of the third non-magnetic metal). For example, the capping pattern 160 may be a molybdenum (Mo) metal layer. In some example embodiments, the capping pattern 160 may be a metal oxide layer including the oxide of the third non-magnetic metal (e.g., formed of the oxide of the third non-magnetic metal). For example, the capping pattern 160 may be a molybdenum oxide layer. The capping pattern 160 may have a thickness 160T in the first direction D1, and for example, the thickness 160T of the capping pattern 160 may range from 1 Å to 50 Å.

The oxygen (O) and/or boron (B) included in the non-magnetic pattern 150 may be diffused around the non-magnetic pattern 150 at a high temperature of 400° C. or more. Since the third non-magnetic metal included in the capping pattern 160 has the oxide/boride formation energies higher than those of the second non-magnetic metal M2, the capping pattern 160 may inhibit the oxygen and/or boron in the non-magnetic pattern 150 from being diffused to the capping pattern 160. Thus, uniform distribution of an oxygen concentration and a boron concentration may be formed in portions of the non-magnetic pattern 150 adjacent to the capping pattern 160. As a result, it is possible to reduce or prevent deterioration of switching characteristics of the magnetic tunnel junction pattern MTJ. Therefore, the switching characteristics of the magnetic tunnel junction pattern MTJ may be improved, and thermal resistance of the magnetic tunnel junction pattern MTJ with respect to a high-temperature manufacturing process may be improved.

A second interlayer insulating layer 180 may be disposed on the first interlayer insulating layer 110 and may cover side surfaces of the lower electrode BE, the magnetic tunnel junction pattern MTJ and the upper electrode TE. The second interlayer insulating layer 180 may include, for example, an oxide, a nitride, and/or an oxynitride.

An upper interconnection line 200 may be disposed on the second interlayer insulating layer 180 and may be connected to the upper electrode TE. The upper interconnection line 200 may be connected to the magnetic tunnel junction pattern MTJ through the upper electrode TE and may function as the bit line BL (e.g., second conductive line) of FIG. 1. The upper interconnection line 200 may extend in a second direction D2. The upper interconnection line 200 may include at least one of a metal (e.g., copper) or a conductive metal nitride.

FIGS. 5A, 5B, 5C, and 5D are enlarged views of the portion 'P1' of FIG. 2 according to some example embodiments of the inventive concepts.

Figure 5A:
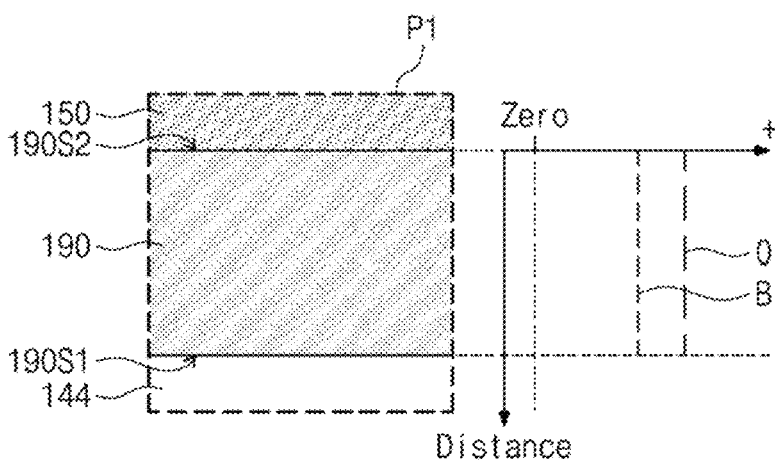
FIGS. 5A, 5B, 5C, and 5D are enlarged views of the portion 'P1' of FIG. 2 according to some example embodiments of the inventive concepts.

Referring to FIG. 5A, in a magnetic memory device according to the present embodiments, a content of the oxygen atoms (O) in the diffusion barrier pattern 190 may be substantially constant regardless of a distance from the second surface 190S2 toward the first surface 190S1. Additionally or alternatively, a content of the boron atoms (B) in the diffusion barrier pattern 190 may be substantially constant regardless of the distance from the second surface 190S2 toward the first surface 190S1. In the present specification, the content may also be referred to as a concentration or a density.

Figure 5B:
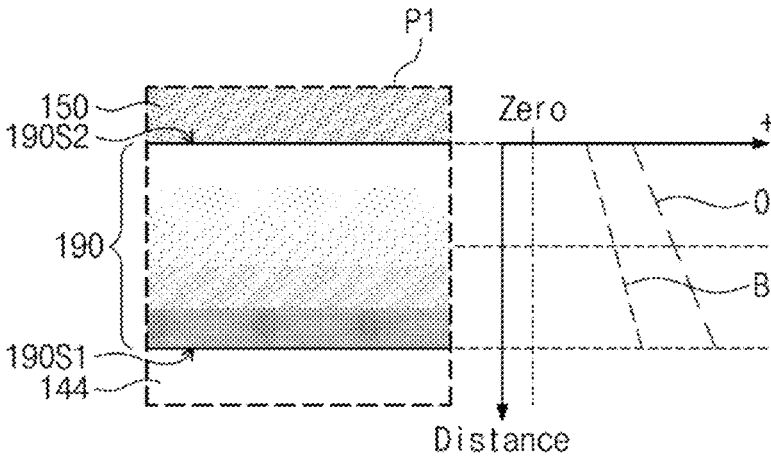

Referring to FIG. 5B, in a magnetic memory device according to the present embodiments, a content of the oxygen atoms (0) in the diffusion barrier pattern 190 may gradually increase as the distance from the second surface 190S2 toward the first surface 190S1 increases. Thus, the content of the oxygen atoms (0) in the diffusion barrier pattern 190 may be minimum at the second surface 190S2 and may be maximum at the first surface 190S1. Additionally or alternatively, a content of the boron atoms (B) in the diffusion barrier pattern 190 may gradually increase as the distance from the second surface 190S2 toward the first surface 190S1 increases. Thus, the content of the boron atoms (B) in the diffusion barrier pattern 190 may be minimum at the second surface 190S2 and may be maximum at the first surface 190S1.

Alternatively, contents of oxygen and boron in the diffusion barrier pattern 190 may be changed stepwise. In detail, referring to FIG. 5C, in a magnetic memory device according to the present embodiments, the diffusion barrier pattern 190 may include a first sub-diffusion barrier pattern 190a and a second sub-diffusion barrier pattern 190b, which are sequentially stacked. Each of the first sub-diffusion barrier pattern 190a and the second sub-diffusion barrier pattern 190b may include the first non-magnetic metal M1, oxygen, and boron. The first sub-diffusion barrier pattern 190a may be adjacent to the second free magnetic pattern 144. The second sub-diffusion barrier pattern 190b may be adjacent to the non-magnetic pattern 150. A content of oxygen atoms in the first sub-diffusion barrier pattern 190a may be greater than a content of oxygen atoms in the second sub-diffusion barrier pattern 190b. A content of boron atoms in the first sub-diffusion barrier pattern 190a may be greater than a content of boron atoms in the second sub-diffusion barrier pattern 190b.

Figure 5C:
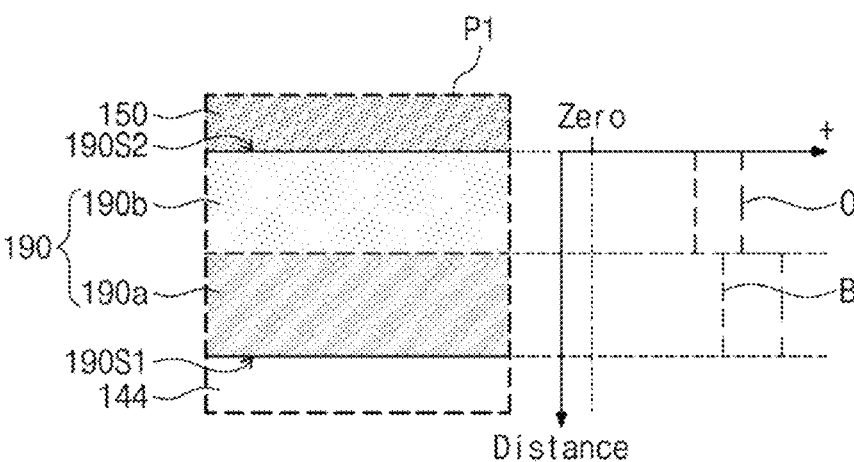
Figure 5D:
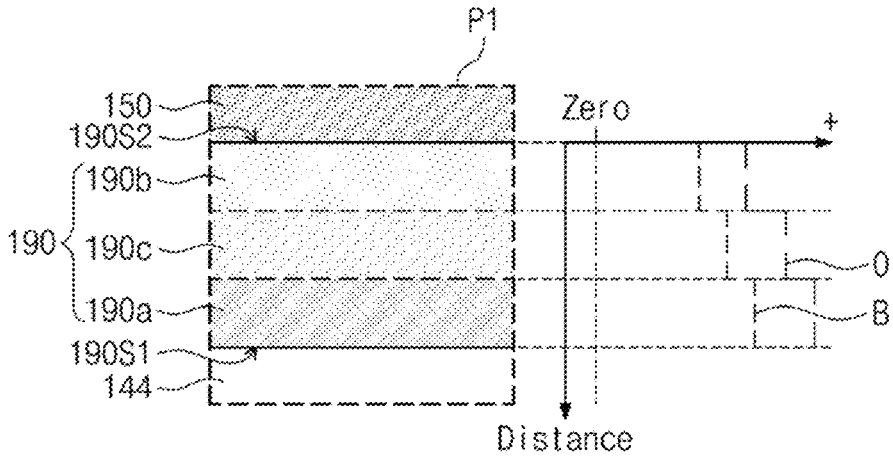

Referring to FIG. 5D, in a magnetic memory device according to the present embodiments, the diffusion barrier pattern 190 may further include a third sub-diffusion barrier pattern 190c disposed between the first sub-diffusion barrier pattern 190a and the second sub-diffusion barrier pattern 190b in the structure of FIG. 5C. The third sub-diffusion barrier pattern 190c may also include the first non-magnetic metal M1, oxygen, and boron. A content of oxygen atoms in the third sub-diffusion barrier pattern 190c may be less than the content of the oxygen atoms in the first sub-diffusion barrier pattern 190a and may be greater than the content of the oxygen atoms in the second sub-diffusion barrier pattern 190b. A content of boron atoms in the third sub-diffusion barrier pattern 190c may be less than the content of the boron atoms in the first sub-diffusion barrier pattern 190a and may be greater than the content of the boron atoms in the second sub-diffusion barrier pattern 190b.

The diffusion barrier pattern 190 has the two-layered or three-layered structure in FIGS. 5C and 5D, but in some example embodiments, the diffusion barrier pattern 190 may have a four or more-layered structure.

Figure 6:
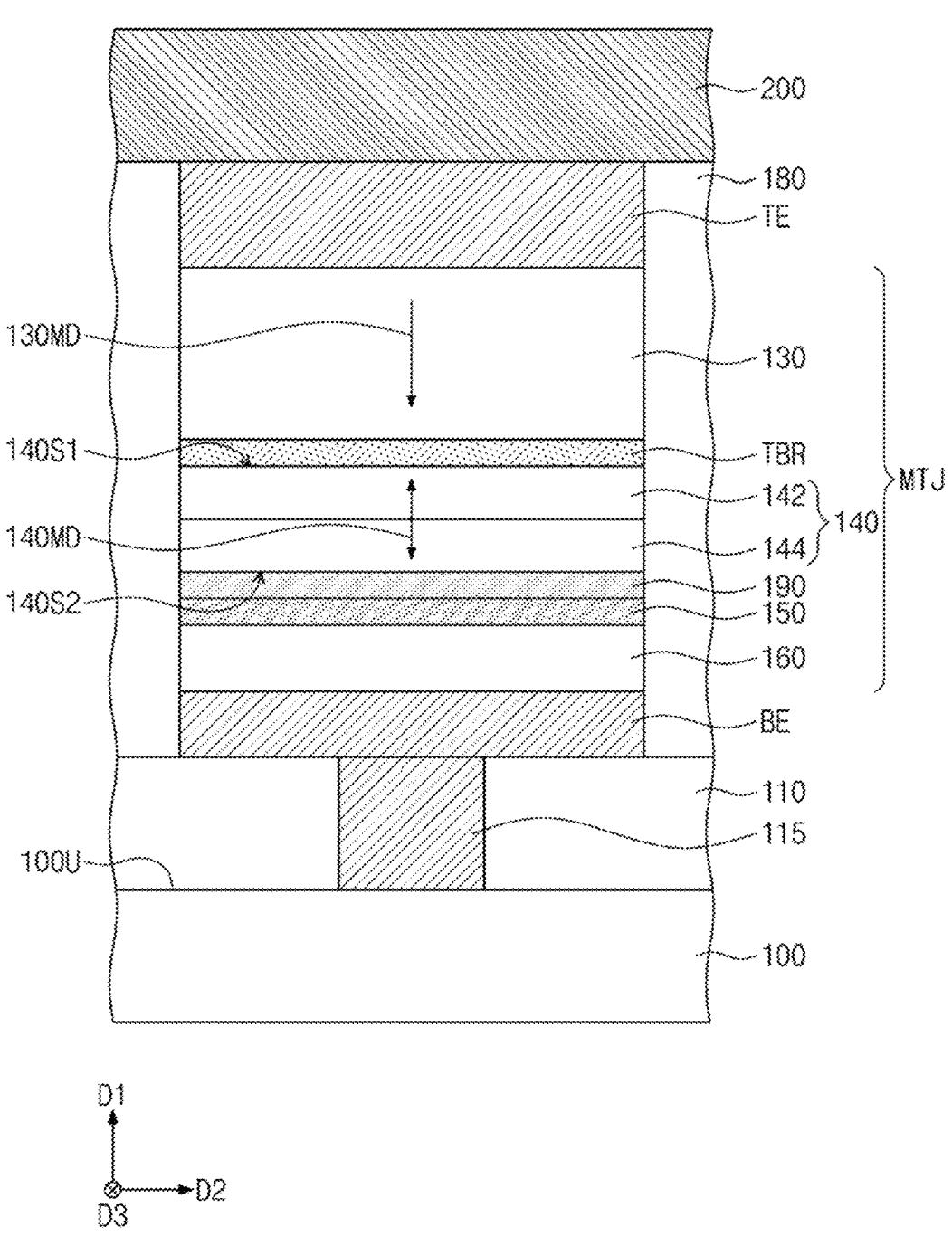
FIG. 6 is a cross-sectional view illustrating a magnetic memory device according to some example embodiments of the inventive concepts.

FIG. 6 is a cross-sectional view illustrating a magnetic memory device according to some example embodiments of the inventive concepts. Hereinafter, differences between the present embodiments and the embodiments of FIGS. 1 and 2 will be mainly described for the purpose of ease and convenience in explanation.

Referring to FIG. 6, a magnetic tunnel junction pattern MTJ may include a capping pattern 160, a non-magnetic pattern 150, a diffusion barrier pattern 190, a free magnetic pattern 140, a tunnel barrier pattern TBR and a pinned magnetic pattern 130, which are sequentially stacked. The free magnetic pattern 140 may include a first free magnetic pattern 142 adjacent to the tunnel barrier pattern TBR, and a second free magnetic pattern 144 far from the tunnel barrier pattern TBR. The second free magnetic pattern 144 may be adjacent to the diffusion barrier pattern 190. The magnetic tunnel junction pattern MTJ of FIG. 6 may have an inverted structure of the magnetic tunnel junction pattern MTJ of FIG. 2 except the seed pattern 120 of FIG. 2. Except for the arrangement of the layers constituting the magnetic tunnel junction pattern MTJ, other features and components of the magnetic memory device according to the present embodiments may be substantially the same as corresponding features and components of the magnetic memory device described with reference to FIGS. 1 and 2.

Figure 7:
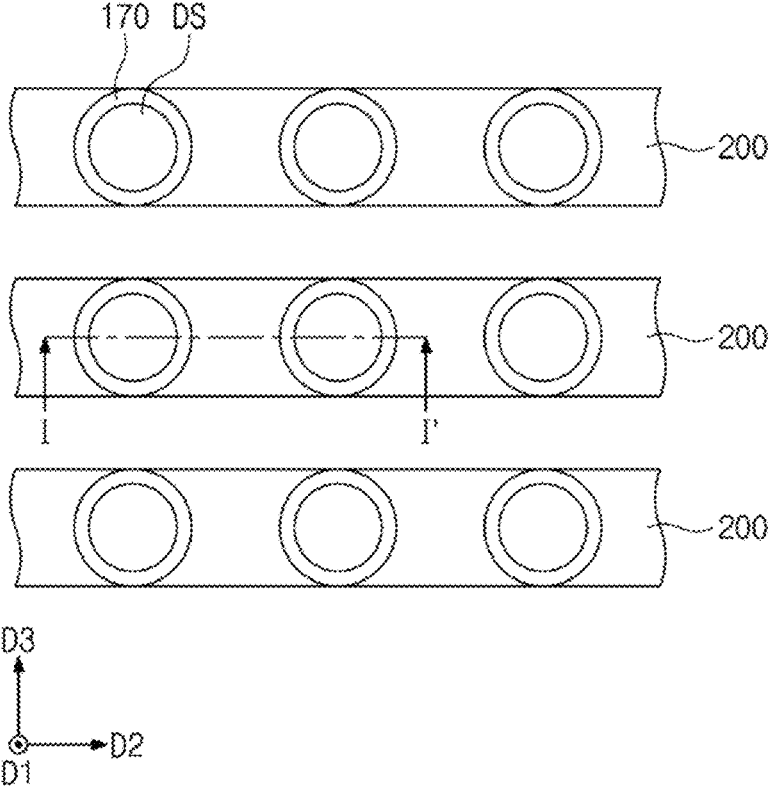
FIG. 7 is a plan view illustrating a magnetic memory device according to some example embodiments of the inventive concepts.
Figure 8:
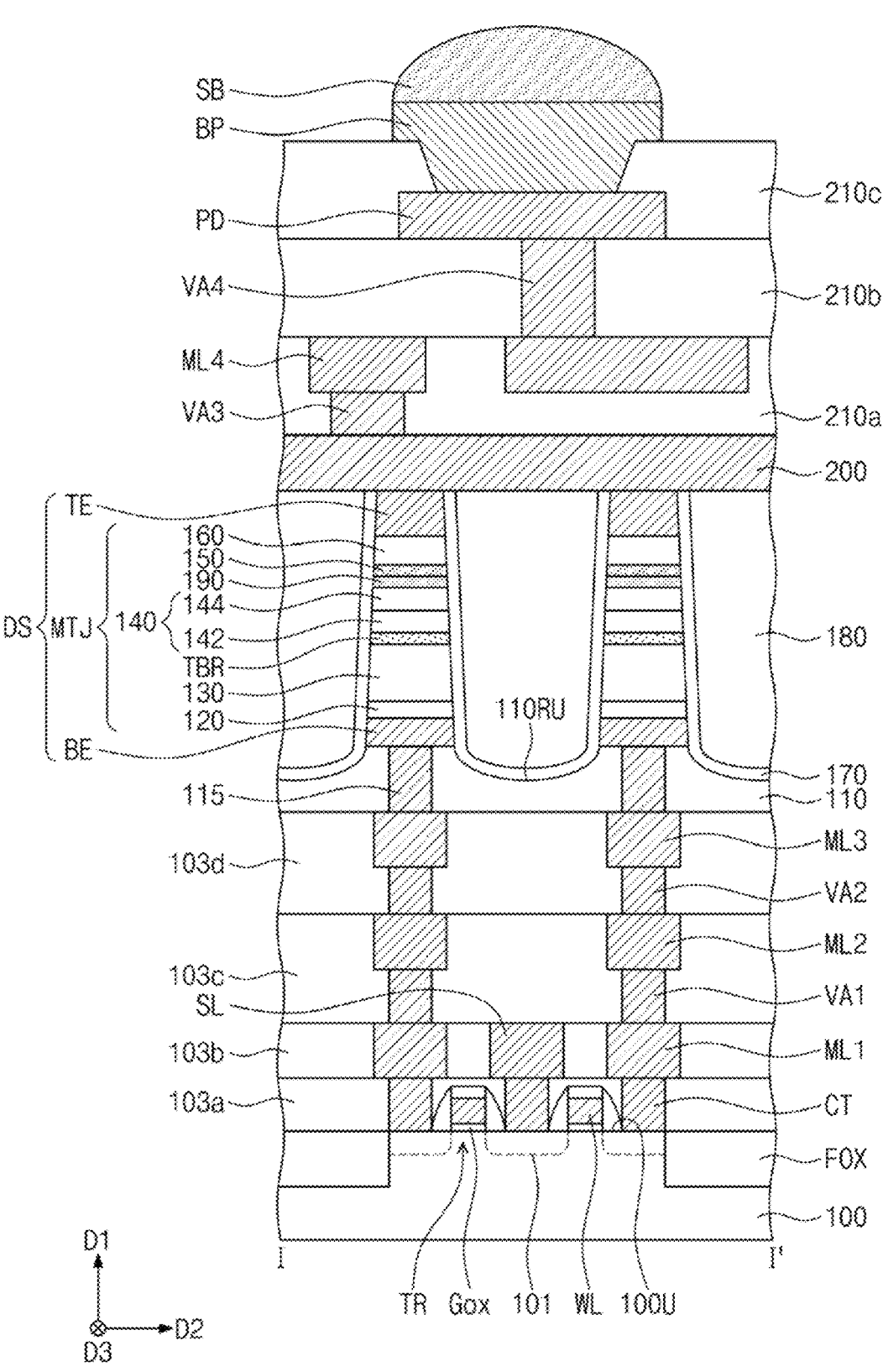
FIG. 8 is a cross-sectional view taken along a line I-I' of FIG. 7 according to some example embodiments of the inventive concepts.

FIG. 7 is a plan view illustrating a magnetic memory device according to some example embodiments of the inventive concepts. FIG. 8 is a cross-sectional view taken along a line I-I' of FIG. 7 according to some example embodiments of the inventive concepts. Hereinafter, the descriptions to the same features and components as described with reference to FIGS. 1 to 6 will be omitted for the purpose of ease and convenience in explanation.

Referring to FIGS. 7 and 8, a device isolation layer FOX may be disposed in a substrate 100 to define active regions. The device isolation layer FOX may have a single-layered or multi-layered structure including at least one of silicon oxide, silicon nitride, or silicon oxynitride. Transistors TR may be disposed on the active regions. Each of the transistors TR may include a gate electrode corresponding to a portion of a word line WL, a gate insulating layer Gox disposed under the gate electrode, and source/drain regions 101 disposed at both sides of the gate electrode. The word line WL is located on the substrate 100 in the present embodiments, but in some example embodiments, the word line WL may be buried in the substrate 100. The word line WL may extend in a third direction D3.

First to fourth lower interlayer insulating layers 103*a*, 103*b*, 103*c* and 103*d* may be sequentially stacked on a top surface 100U of the substrate 100. Each of the first to fourth lower interlayer insulating layers 103*a*, 103*b*, 103*c* and 103*d* may have a single-layered or multi-layered structure including at least one of silicon oxide, silicon nitride, silicon oxynitride, or a porous insulating material. Lower contact plugs CT may penetrate the first lower interlayer insulating layer 103*a* so as to be in contact with the source/drain regions 101. A source line SL and a first interconnection layer ML1 may be disposed in the second lower interlayer insulating layer 103*b*. The source line SL may be connected to a corresponding one of the lower contact plugs CT. The source line SL may extend in the third direction D3. A second interconnection layer ML2 and first via plugs VA1 may be disposed in the third lower interlayer insulating layer 103*c*. A third interconnection layer ML3 and second via plugs VA2 may be disposed in the fourth lower interlayer insulating layer 103*d*. Each of the first to third interconnection layers ML1 to ML3 may include interconnection lines and pads. The source line SL may correspond to at least one of the interconnection lines of the first interconnection layer ML1.

A first interlayer insulating layer 110 may be disposed on the fourth lower interlayer insulating layer 103*d*. A plurality of first contact plugs 115 may penetrate the first interlayer insulating layer 110 so as to be connected to the third interconnection layer ML3. The first contact plugs 115 may be spaced apart from each other in the second and third directions D2 and D3 parallel to the top surface 100U of the substrate 100. The second direction D2 and the third direction D3 may intersect each other. Each of the first contact plugs 115 may be connected to a corresponding one of the source/drain regions 101 of the transistors TR.

A plurality of data storage patterns DS may be disposed on the first interlayer insulating layer 110 and may be spaced apart from each other in the second direction D2 and the third direction D3. The plurality of data storage patterns DS may be disposed on the plurality of first contact plugs 115, respectively, and may be connected to the plurality of first contact plugs 115, respectively.

Each of the plurality of data storage patterns DS may include a lower electrode BE, a magnetic tunnel junction pattern MTJ and an upper electrode TE, which are sequentially stacked on a corresponding first contact plug 115. The lower electrode BE may be disposed between the corresponding first contact plug 115 and the magnetic tunnel junction pattern MTJ, and the magnetic tunnel junction pattern MTJ may be disposed between the lower electrode BE and the upper electrode TE. The magnetic tunnel junction pattern MTJ may be substantially the same as one of the magnetic tunnel junction patterns MTJ described with reference to FIGS. 2 to 6. In some example embodiments, as described with reference to FIG. 2, the magnetic tunnel junction pattern MTJ may include the seed pattern 120, the pinned magnetic pattern 130, the tunnel barrier pattern TBR, the free magnetic pattern 140, the diffusion barrier pattern 190, the non-magnetic pattern 150 and the capping pattern 160, which are sequentially stacked.

In some example embodiments, a top surface of the first interlayer insulating layer 110 may be recessed toward the substrate 100 between the plurality of data storage patterns DS. A protection insulating layer 170 may surround a side surface of each of the plurality of data storage patterns DS. The protection insulating layer 170 may cover side surfaces of the lower electrode BE, the magnetic tunnel junction pattern MTJ and the upper electrode TE and may surround the side surfaces of the lower electrode BE, the magnetic tunnel junction pattern MTJ and the upper electrode TE when viewed in a plan view. The protection insulating layer 170 may extend from the side surface of each of the plurality of data storage patterns DS onto a recessed top surface 110RU of the first interlayer insulating layer 110. The protection insulating layer 170 may conformally cover the recessed top surface 110RU of the first interlayer insulating layer 110. The protection insulating layer 170 may include a nitride (e.g., silicon nitride).

A second interlayer insulating layer 180 may be disposed on the first interlayer insulating layer 110 and may cover the plurality of data storage patterns DS. The protection insulating layer 170 may be disposed between the side surface of each of the plurality of data storage patterns DS and the second interlayer insulating layer 180 and may extend between the recessed top surface 110RU of the first interlayer insulating layer 110 and the second interlayer insulating layer 180.

A plurality of upper interconnection lines 200 may be disposed on the second interlayer insulating layer 180. The plurality of upper interconnection lines 200 may extend in the second direction D2 and may be spaced apart from each other in the third direction D3. Each of the plurality of upper interconnection lines 200 may be connected to data storage patterns DS, spaced apart from each other in the second direction D2, of the plurality of data storage patterns DS.

First to third upper interlayer insulating layers 210*a* to 210*c* may be sequentially stacked on the upper interconnection lines 200. Each of the first to third upper interlayer insulating layers 210*a* to 210*c* may have a single-layered or multi-layered structure including at least one of silicon oxide, silicon nitride, silicon oxynitride, or a porous insulating material. A fourth interconnection layer ML4 and third via plugs VA3 may be disposed in the first upper interlayer insulating layer 210*a*. The fourth interconnection layer ML4 may include interconnection lines and pads. One of the third via plugs VA3 may be in contact with one of the upper interconnection lines 200. A fourth via plug VA4 may be disposed in the second upper interlayer insulating layer 210*b*. A bonding pad PD may be disposed in the third upper interlayer insulating layer 210*c*. The bonding pad PD may be connected to the fourth via plug VA4. A conductive bump BP may penetrate the third upper interlayer insulating layer 210*c* so as to be connected to the bonding pad PD. A solder layer SB may be bonded onto the conductive bump BP. The conductive bump BP may include a metal (e.g., copper). The solder layer SB may include at least one of, for example, tin, lead, or silver.

FIGS. 9A, 9B, 9C, and 9D are cross-sectional views illustrating a method of manufacturing the magnetic memory device of FIG. 8.

Figure 9A:
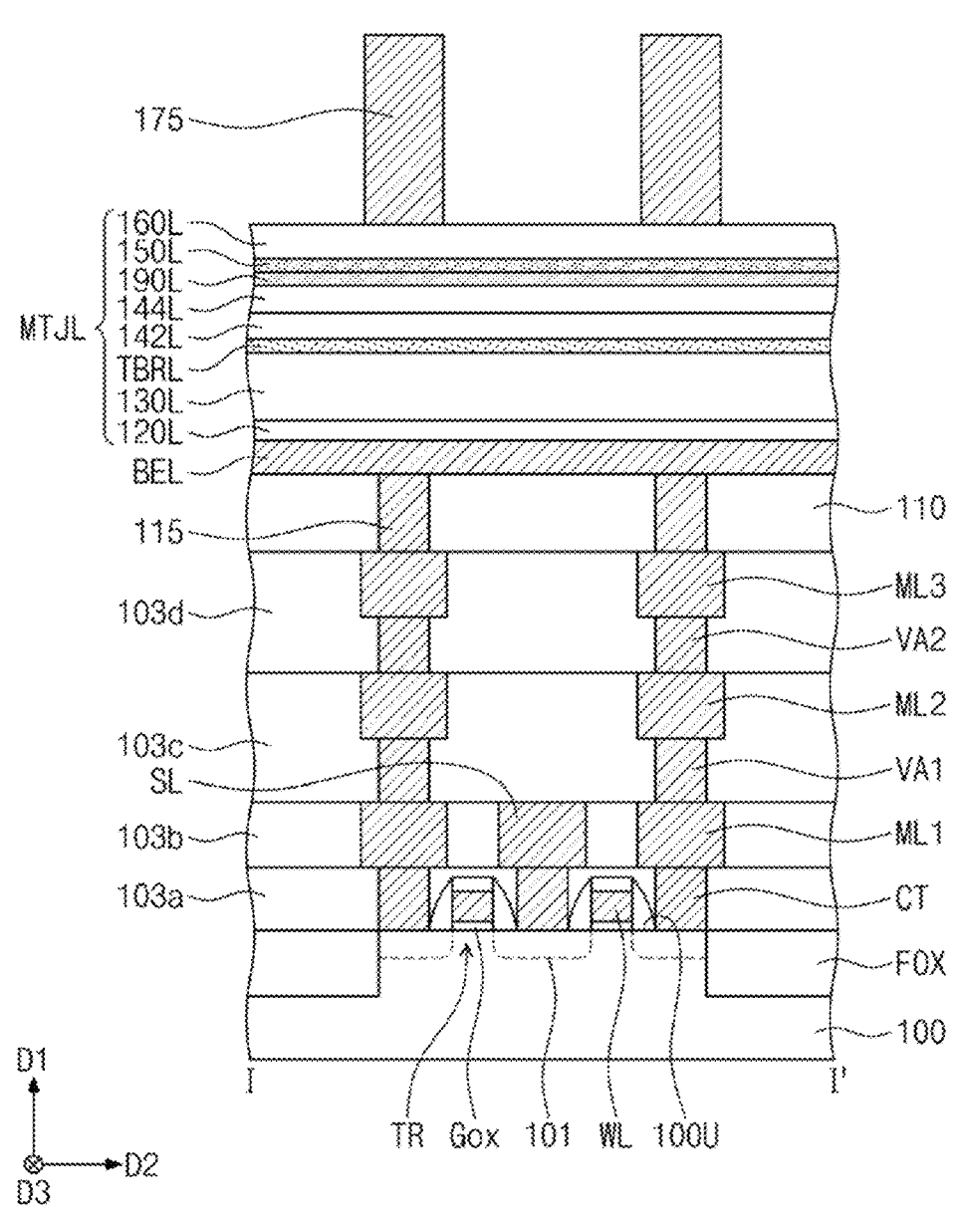
FIGS. 9A, 9B, 9C, and 9D are cross-sectional views illustrating a method of manufacturing the magnetic memory device of FIG. 8 according to some example embodiments of the inventive concepts.

Referring to FIG. 9A, a device isolation layer FOX may be formed in a substrate 100 to define active regions. Transistors TR may be formed on the substrate 100, and a first lower interlayer insulating layer 103*a* may be formed to cover the transistors TR. Lower contact plugs CT may be formed in the first lower interlayer insulating layer 103*a*. A source line SL and a first interconnection layer ML1 may be formed on the first lower interlayer insulating layer 103*a*. A second lower interlayer insulating layer 103*b* may be formed to fill a space between interconnection lines and pads of the first interconnection layer ML1. A third lower interlayer insulating layer 103c may be formed on the second lower interlayer insulating layer 103b. First via plugs VA1 and a second interconnection layer ML2 may be formed in the third lower interlayer insulating layer 103c. A fourth lower interlayer insulating layer 103d may be formed on the third lower interlayer insulating layer 103c. Second via plugs VA2 and a third interconnection layer ML3 may be formed in the fourth lower interlayer insulating layer 103d.

A first interlayer insulating layer 110 may be formed on the fourth lower interlayer insulating layer 103d. First contact plugs 115 may be formed in the first interlayer insulating layer 110. A lower electrode layer BEL and a magnetic tunnel junction layer MTJL may be sequentially formed on the first interlayer insulating layer 110. In some example embodiments, the magnetic tunnel junction layer MTJL may include a seed layer 120L, a pinned magnetic layer 130L, a tunnel barrier layer TBRL, a free magnetic layer 140L, a diffusion barrier layer 190L, a non-magnetic layer 150L and a capping layer 160L, which are sequentially stacked on the lower electrode layer BEL. The free magnetic layer 140L may include a first free magnetic layer 142L and a second free magnetic layer 144L, which are sequentially stacked on the tunnel barrier layer TBRL. The lower electrode layer BEL and the magnetic tunnel junction layer MTJL may be formed using, for example, a sputtering process, a chemical vapor deposition (CVD) process, or an atomic layer deposition (ALD) process.

Conductive mask patterns 175 may be formed on the magnetic tunnel junction layer MTJL. The conductive mask patterns 175 may define regions in which magnetic tunnel junction patterns to be described later will be formed. The conductive mask patterns 175 may include at least one of a metal (e.g., Ta, W, Ru, or Ir) or a conductive metal nitride (e.g., TiN).

Figure 9B:
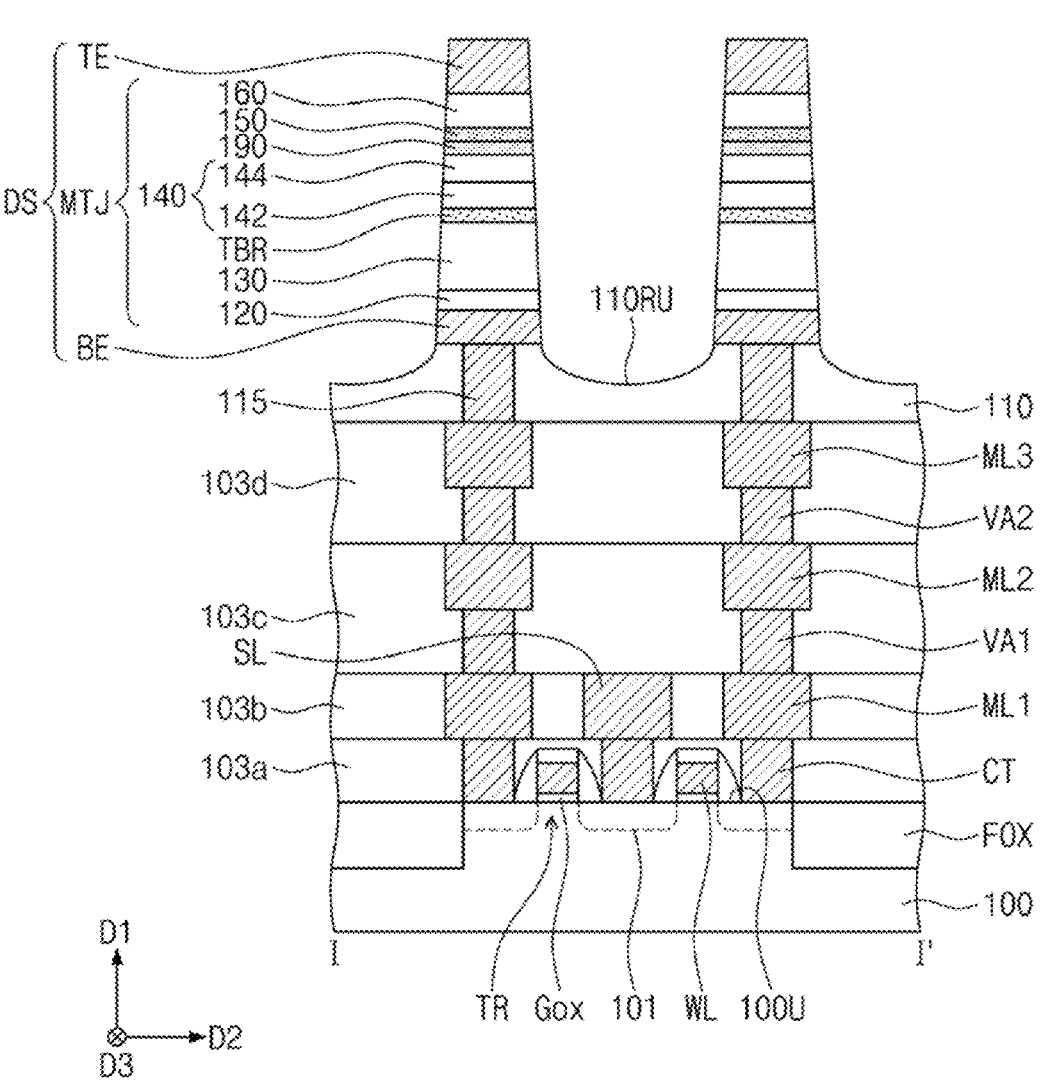

Referring to FIG. 9B, the magnetic tunnel junction layer MTJL and the lower electrode layer BEL may be sequentially etched using the conductive mask patterns 175 as etch masks. Thus, a magnetic tunnel junction pattern MTJ and a lower electrode BE may be formed on the first interlayer insulating layer 110. The lower electrode BE may be connected to a corresponding first contact plug 115, and the magnetic tunnel junction pattern MTJ may be formed on the lower electrode BE.

The etching of the magnetic tunnel junction layer MTJL may include sequentially etching the capping layer 160L, the non-magnetic layer 150L, the diffusion barrier layer 190L, the free magnetic layer 140L, the tunnel barrier layer TBRL, the pinned magnetic layer 130L and the seed layer 120L by using the conductive mask patterns 175 as etch masks. Thus, the magnetic tunnel junction pattern MTJ may include a seed pattern 120, a pinned magnetic pattern 130, a tunnel barrier pattern TBR, a free magnetic pattern 140, a diffusion barrier pattern 190, a non-magnetic pattern 150 and a capping pattern 160, which are sequentially stacked on the lower electrode BE. The free magnetic pattern 140 may include a first free magnetic pattern 142 and a second free magnetic pattern 144, formed by etching the first free magnetic layer 142L and the second free magnetic layer 144L.

For example, an etching process of etching the magnetic tunnel junction layer MTJL and the lower electrode layer BEL may be an ion beam etching process using an ion beam. The ion beam may include inert ions. A top surface of the first interlayer insulating layer 110 at both sides of the magnetic tunnel junction pattern MTJ may be recessed by the ion beam etching process. Thus, the first interlayer insulating layer 110 may have a recessed top surface 110RU at both sides of the magnetic tunnel junction pattern MTJ.

After the ion beam etching process, a portion of each of the conductive mask patterns 175 may remain on the magnetic tunnel junction pattern MTJ. The remaining portion of each of the conductive mask patterns 175 may function as an upper electrode TE. Hereinafter, the remaining portion of each of the conductive mask patterns 175 may be referred to as the upper electrode TE. The upper electrode TE, the magnetic tunnel junction pattern MTJ and the lower electrode BE may constitute a data storage pattern DS.

Figure 9C:
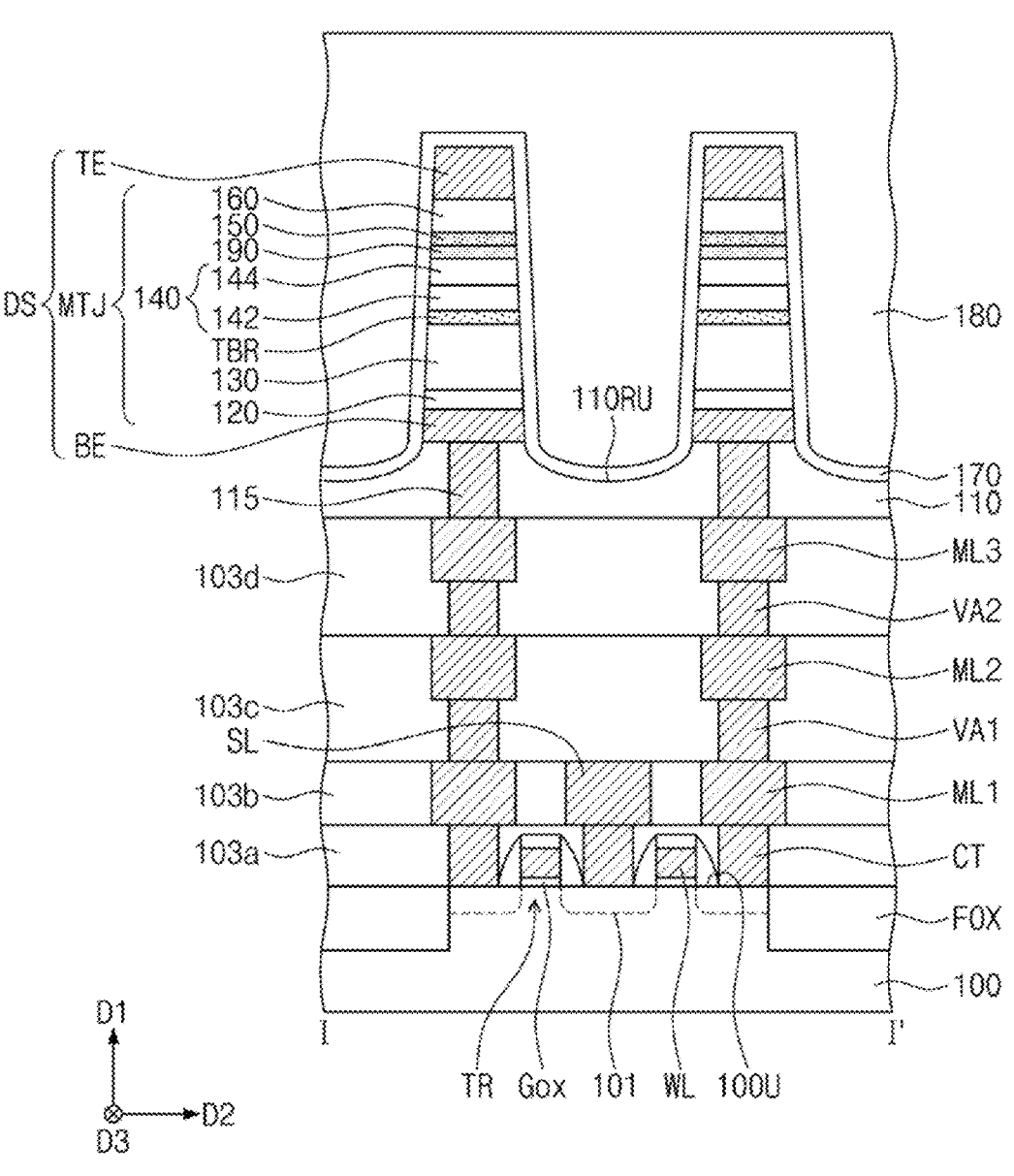

Referring to FIG. 9C, a protection insulating layer 170 may be formed on the first interlayer insulating layer 110 to cover the data storage pattern DS. The protection insulating layer 170 may conformally cover a top surface and a side surface of the data storage pattern DS and may extend along the recessed top surface 110RU of the first interlayer insulating layer 110. A second interlayer insulating layer 180 may be formed on the protection insulating layer 170 to cover the data storage pattern DS.

Figure 9D:
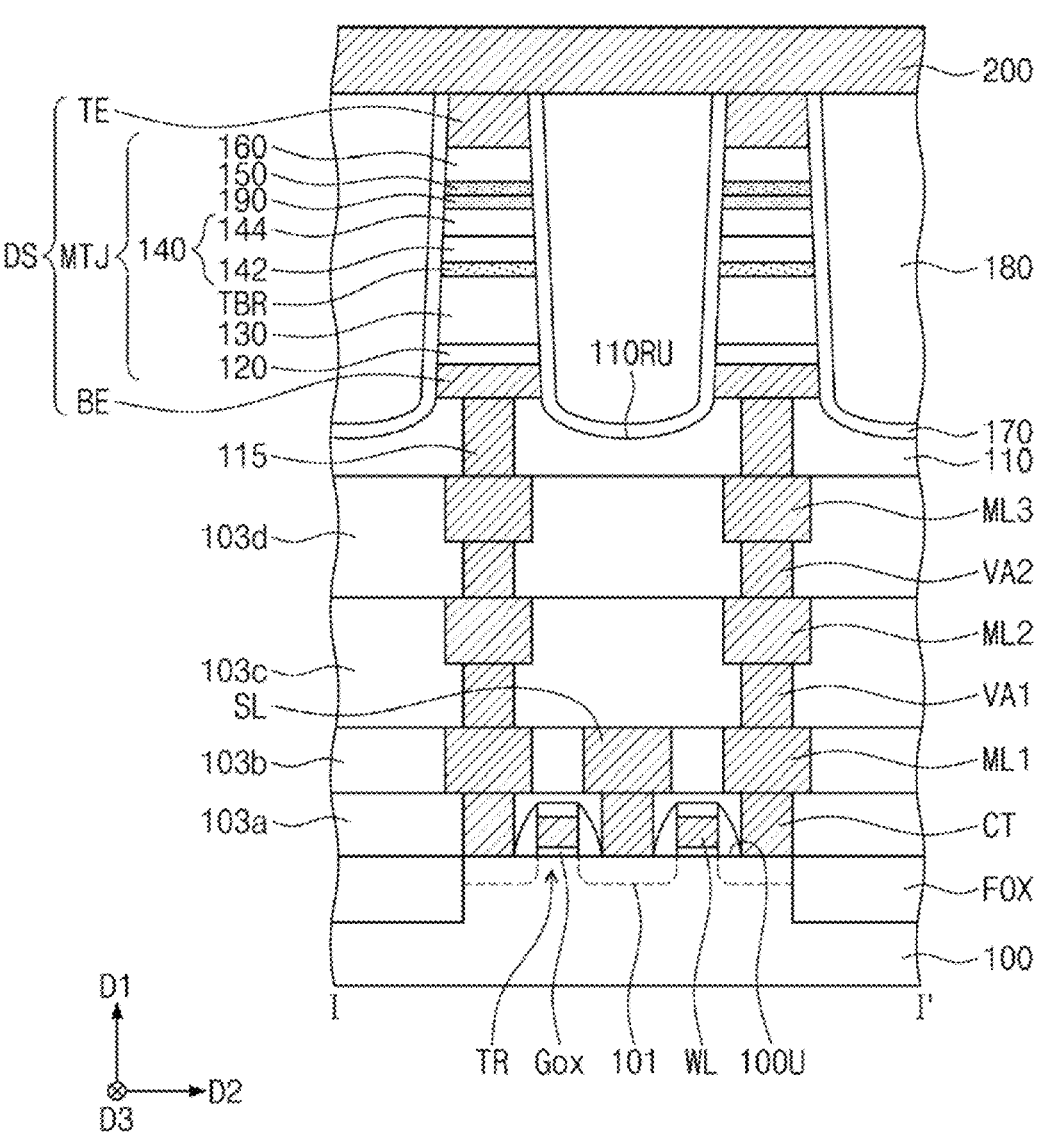

Referring to FIG. 9D, a chemical mechanical polishing (CMP) process or an etch-back process may be performed to remove portions of the second interlayer insulating layer 180 and the protection insulating layer 170 and to expose a top surface of the upper electrode TE of the data storage pattern DS. An upper interconnection line 200 may be formed on the second interlayer insulating layer 180 and may cover the exposed top surface of the upper electrode TE. The upper interconnection line 200 may be electrically connected to the upper electrode TE.

Referring again to FIG. 8, a back-end-of-line (BEOL) process may be performed to form first to third upper interlayer insulating layers 210a to 210c, third and fourth via plugs VA3 and VA4, a fourth interconnection layer ML4, a bonding pad PD, a conductive bump BP and a solder layer SB on the upper interconnection line 200.

A high temperature of 400° C. or more may be required when the fourth interconnection layer ML4, etc. is formed in the BEOL process. At this time, oxygen (O) and/or boron (B) included in the non-magnetic pattern 150 may be diffused around the non-magnetic pattern 150 at the high temperature of 400° C. or more. If oxygen (O) and/or boron (B) included in the non-magnetic pattern 150 is diffused into the second free magnetic pattern 144, local distribution (or clumped dispersion) of an oxygen/boron content may be formed in the second free magnetic pattern 144, and thus switching distribution may be deteriorated. However, the diffusion barrier pattern 190 according to the inventive concepts may reduce or prevent oxygen (O) and/or boron (B) included in the non-magnetic pattern 150 from being diffused into the second free magnetic pattern 144. Thus, an oxygen concentration and a boron concentration may have uniform distribution in local regions in the free magnetic pattern 140 adjacent to the diffusion barrier pattern 190. As a result, it is possible to reduce or prevent deterioration of switching characteristics of the magnetic tunnel junction pattern MTJ. Therefore, the switching characteristics of the magnetic tunnel junction pattern MTJ may be improved, and thermal resistance of the magnetic tunnel junction pattern MTJ with respect to a high-temperature manufacturing process may be improved.

In addition, the capping pattern 160 may inhibit oxygen and/or boron in the non-magnetic pattern 150 from being diffused to the capping pattern 160. Thus, uniform distribution of an oxygen concentration and a boron concentration may be formed in portions of the non-magnetic pattern 150 adjacent to the capping pattern 160. As a result, it is possible to reduce or prevent deterioration of switching characteristics of the magnetic tunnel junction pattern MTJ. Therefore, the switching characteristics of the magnetic tunnel junction pattern MTJ may be improved, and thermal resistance of the magnetic tunnel junction pattern MTJ with respect to a high-temperature manufacturing process may be improved.

As a result, the embodiments of the inventive concepts may provide the magnetic memory device including the magnetic tunnel junction pattern with the improved switching characteristics and the improved thermal resistance with respect to a high-temperature manufacturing process, and the method of manufacturing the same.

According to the inventive concepts, the magnetic tunnel junction pattern may include the diffusion barrier pattern, the non-magnetic pattern and the capping pattern, which are sequentially stacked on one surface of the free magnetic pattern. The diffusion barrier pattern may reduce or prevent oxygen and/or boron from being diffused from the non-magnetic pattern to the free magnetic pattern. The capping pattern may inhibit oxygen and/or boron from being diffused from the non-magnetic pattern to the capping pattern. Thus, the oxygen concentration and the boron concentration may have uniform distribution in local regions in the free magnetic pattern adjacent to the diffusion barrier pattern. In addition, the capping pattern may inhibit oxygen and/or boron in the non-magnetic pattern from being diffused to the capping pattern. Thus, the oxygen concentration and the boron concentration may have uniform distribution in portions of the non-magnetic pattern adjacent to the capping pattern.

As a result, the embodiments of the inventive concepts may provide the magnetic memory device including the magnetic tunnel junction pattern with the improved switching characteristics and the improved thermal resistance with respect to a high-temperature manufacturing process, and the method of manufacturing the same.

While some example embodiments of the inventive concepts have been particularly shown and described, it will be understood by one of ordinary skill in the art that variations in form and detail may be made therein without departing from the spirit and scope of the attached claims.

What is claimed is:

1. A magnetic memory device, comprising:
a pinned magnetic pattern, a tunnel barrier pattern, a free magnetic pattern, a diffusion barrier pattern, a non-magnetic pattern and a capping pattern, which are sequentially stacked on a substrate,
wherein the non-magnetic pattern is interposed between the capping pattern and the diffusion barrier pattern,
wherein the diffusion barrier pattern includes a first non-magnetic metal and oxygen,
wherein the non-magnetic pattern includes a second non-magnetic metal and oxygen,
wherein the capping pattern comprises a third non-magnetic metal,
wherein an oxide formation energy of the first non-magnetic metal is lower than an oxide formation energy of the second non-magnetic metal, and
wherein an oxide formation energy of the third non-magnetic metal is higher than the oxide formation energy of the second non-magnetic metal.

2. The magnetic memory device of claim 1, wherein a content of the oxygen in the diffusion barrier pattern increases toward the free magnetic pattern and decreases toward the non-magnetic pattern.

3. The magnetic memory device of claim 1, wherein
the diffusion barrier pattern comprises a first sub-diffusion barrier pattern and a second sub-diffusion barrier pattern, which are sequentially stacked,
the first sub-diffusion barrier pattern is adjacent to the free magnetic pattern,
the second sub-diffusion barrier pattern is adjacent to the non-magnetic pattern,
each of the first sub-diffusion barrier pattern and the second sub-diffusion barrier pattern includes the first non-magnetic metal and the oxygen, and
a content of the oxygen in the first sub-diffusion barrier pattern is greater than a content of the oxygen in the second sub-diffusion barrier pattern.

4. The magnetic memory device of claim 3, wherein
the diffusion barrier pattern further comprises a third sub-diffusion barrier pattern between the first sub-diffusion barrier pattern and the second sub-diffusion barrier pattern,
the third sub-diffusion barrier pattern includes the first non-magnetic metal and the oxygen, and
a content of the oxygen in the third sub-diffusion barrier pattern is
less than the content of the oxygen in the first sub-diffusion barrier pattern, and
greater than the content of the oxygen in the second sub-diffusion barrier pattern.

5. The magnetic memory device of claim 1, wherein the non-magnetic pattern further includes boron.

6. The magnetic memory device of claim 1, wherein the diffusion barrier pattern includes boron, and wherein a content of the boron in the diffusion barrier pattern increases toward the free magnetic pattern and decreases toward the non-magnetic pattern.

7. The magnetic memory device of claim 1, wherein the diffusion barrier pattern includes boron, and wherein:
the diffusion barrier pattern comprises a first sub-diffusion barrier pattern and a second sub-diffusion barrier pattern, which are sequentially stacked,
the first sub-diffusion barrier pattern is adjacent to the free magnetic pattern,
the second sub-diffusion barrier pattern is adjacent to the non-magnetic pattern,
each of the first sub-diffusion barrier pattern and the second sub-diffusion barrier pattern includes the first non-magnetic metal and the boron, and
a content of the boron in the first sub-diffusion barrier pattern is greater than a content of the boron in the second sub-diffusion barrier pattern.

8. The magnetic memory device of claim 7, wherein
the diffusion barrier pattern further comprises a third sub-diffusion barrier pattern between the first sub-diffusion barrier pattern and the second sub-diffusion barrier pattern,
the third sub-diffusion barrier pattern includes the first non-magnetic metal and the boron, and
a content of the boron in the third sub-diffusion barrier pattern is
less than the content of the boron in the first sub-diffusion barrier pattern, and
greater than the content of the boron in the second sub-diffusion barrier pattern.

9. The magnetic memory device of claim 1, wherein each of the diffusion barrier pattern and the non-magnetic pattern has a thickness of 1 Å to 15 Å.

10. The magnetic memory device of claim 1, wherein the first non-magnetic metal includes at least one of hafnium (Hf), titanium (Ti), zirconium (Zr), niobium (Nb), vanadium (V), or scandium (Sc), and the second non-magnetic metal includes at least one of tantalum (Ta), tungsten (W), molybdenum (Mo), chromium (Cr), rhenium (Re), or manganese (Mn).

11. A magnetic memory device, comprising:

a pinned magnetic pattern, a tunnel barrier pattern, a free magnetic pattern, a diffusion barrier pattern, a non-magnetic pattern and a capping pattern, which are sequentially stacked on a substrate, wherein the diffusion barrier pattern includes a first non-magnetic metal, oxygen, and boron, wherein the non-magnetic pattern includes a second non-magnetic metal, oxygen, and boron, and wherein a boride formation energy of the first non-magnetic metal is lower than a boride formation energy of the second non-magnetic metal.

12. The magnetic memory device of claim 11, wherein an oxide formation energy of the first non-magnetic metal is lower than an oxide formation energy of the second non-magnetic metal.

13. The magnetic memory device of claim 11, wherein a content of the oxygen in the diffusion barrier pattern increases toward the free magnetic pattern and decreases toward the non-magnetic pattern.

14. The magnetic memory device of claim 11, wherein the diffusion barrier pattern comprises a first sub-diffusion barrier pattern and a second sub-diffusion barrier pattern, which are sequentially stacked, the first sub-diffusion barrier pattern is adjacent to the free magnetic pattern, the second sub-diffusion barrier pattern is adjacent to the non-magnetic pattern, each of the first sub-diffusion barrier pattern and the second sub-diffusion barrier pattern includes the first non-magnetic metal and the oxygen, and a content of the oxygen in the first sub-diffusion barrier pattern is greater than a content of the oxygen in the second sub-diffusion barrier pattern.

15. The magnetic memory device of claim 11, wherein a content of the boron in the diffusion barrier pattern increases toward the free magnetic pattern and decreases toward the non-magnetic pattern.

16. The magnetic memory device of claim 11, wherein the diffusion barrier pattern comprises a first sub-diffusion barrier pattern and a second sub-diffusion barrier pattern, which are sequentially stacked, the first sub-diffusion barrier pattern is adjacent to the free magnetic pattern, the second sub-diffusion barrier pattern is adjacent to the non-magnetic pattern, each of the first sub-diffusion barrier pattern and the second sub-diffusion barrier pattern includes the first non-magnetic metal and the boron, and a content of the boron in the first sub-diffusion barrier pattern is greater than a content of the boron in the second sub-diffusion barrier pattern.

17. A magnetic memory device, comprising:

a first conductive line on a substrate;

a second conductive line extending over the first conductive line; and a memory cell between the first conductive line and the second conductive line, wherein the memory cell includes a pinned magnetic pattern, a tunnel barrier pattern, a free magnetic pattern, a diffusion barrier pattern, a non-magnetic pattern and a capping pattern, which are sequentially stacked, wherein the diffusion barrier pattern includes hafnium, oxygen, and boron, wherein the non-magnetic pattern includes tantalum, oxygen, and boron, and wherein each of the diffusion barrier pattern and the non-magnetic pattern has a thickness of 1 Å to 15 Å.

18. The magnetic memory device of claim 17, wherein a content of the oxygen in the diffusion barrier pattern increases toward the free magnetic pattern and decreases toward the non-magnetic pattern.

19. The magnetic memory device of claim 17, wherein the diffusion barrier pattern comprises a first sub-diffusion barrier pattern and a second sub-diffusion barrier pattern, which are sequentially stacked, the first sub-diffusion barrier pattern is adjacent to the free magnetic pattern, the second sub-diffusion barrier pattern is adjacent to the non-magnetic pattern, each of the first sub-diffusion barrier pattern and the second sub-diffusion barrier pattern includes the hafnium, the oxygen, and the boron, and a content of the oxygen in the first sub-diffusion barrier pattern is greater than a content of the oxygen in the second sub-diffusion barrier pattern.

20. The magnetic memory device of claim 17, wherein a content of the boron in the diffusion barrier pattern increases toward the free magnetic pattern and decreases toward the non-magnetic pattern.

* * * * *